United States Patent
Huang et al.

(10) Patent No.: US 7,528,482 B2
(45) Date of Patent: May 5, 2009

(54) EMBEDDED CHIP PACKAGE WITH IMPROVED HEAT DISSIPATION PERFORMANCE AND METHOD OF MAKING THE SAME

(75) Inventors: Cheng-Hung Huang, Taipei (TW); Hsien-Chieh Lin, Taoyuan County (TW); Kuo-Chun Chiang, Taoyuan (TW); Shing-Fun Ho, Taipei (TW)

(73) Assignee: Nan Ya Printed Circuit Board Corporation, Lunchu, Taoyuan (TW)

( * ) Notice: Subject to any disclaimer, the term of this patent is extended or adjusted under 35 U.S.C. 154(b) by 0 days.

(21) Appl. No.: 11/672,507

(22) Filed: Feb. 7, 2007

(65) Prior Publication Data

US 2008/0116569 A1  May 22, 2008

(30) Foreign Application Priority Data

Nov. 16, 2006  (TW) .............................. 95142443 A

(51) Int. Cl.
*H01L 23/10* (2006.01)

(52) U.S. Cl. .............................. 257/710; 257/E21.503; 257/712; 257/718; 257/730; 257/E23.006; 257/E23.069; 257/E23.109; 257/E23.14; 257/E23.189

(58) Field of Classification Search ................. 257/710, 257/712, 718, 730, E21.503, E23.006, E23.069, 257/E23.109, E23.14, E23.189
See application file for complete search history.

(56) References Cited

U.S. PATENT DOCUMENTS

| | | | | |
|---|---|---|---|---|
| 5,583,378 A | * | 12/1996 | Marrs et al. .................. | 257/710 |
| 5,832,601 A | * | 11/1998 | Eldridge et al. ............... | 29/843 |
| 5,974,662 A | * | 11/1999 | Eldridge et al. ............... | 29/842 |
| 5,990,545 A | * | 11/1999 | Schueller et al. ............. | 257/697 |
| 6,320,257 B1 | * | 11/2001 | Jayaraj et al. ................ | 257/723 |
| 6,323,065 B1 | * | 11/2001 | Karnezos ..................... | 438/122 |
| 6,537,848 B2 | * | 3/2003 | Camenforte et al. ......... | 438/106 |
| 6,706,564 B2 | * | 3/2004 | Kim et al. .................... | 438/125 |
| 6,753,600 B1 | * | 6/2004 | Ho .............................. | 257/698 |
| 6,872,589 B2 | * | 3/2005 | Strandberg et al. .......... | 438/106 |

\* cited by examiner

*Primary Examiner*—M. Wilczewski
*Assistant Examiner*—Tsz K Chiu
(74) *Attorney, Agent, or Firm*—Winston Hsu

(57) ABSTRACT

A Chip-in Substrate Package (CiSP) includes a double-sided metal clad laminate including a dielectric interposer, a first metal foil laminated on a first side of the dielectric interposer, and a second metal foil laminated on a second side of the dielectric interposer. A recessed cavity is etched into the second metal foil and the dielectric interposer with a portion of the first metal foil as its bottom. A die is mounted within the recessed cavity and makes thermal contact with the first metal foil. A build-up material layer covers the second metal foil and an active surface of the die. The build-up material layer also fills the gap between the die and the dielectric interposer. At least one interconnection layer is provided on the build-up material layer and is electrically connected with a bonding pad disposed on the active surface of the die via a plated through hole.

11 Claims, 23 Drawing Sheets

EMBEDDED CHIP PACKAGE WITH IMPROVED HEAT DISSIPATION PERFORMANCE AND METHOD OF MAKING THE SAME

BACKGROUND OF THE INVENTION

1. Field of the Invention

The present invention relates to a chip package, and more particularly to an embedded chip package with improved heat dissipation performance.

2. Description of the Prior Art

With the rapid development of electronic technology, the number of I/O pads in microcontrollers is drastically increasing, and the power that each silicon chip consumes has also increased. In the future, microcontrollers may have more pins. For chip packages, electrical performance and dissipation control are two major challenges. In the aspect of electrical performance, chip packages have to maintain integrity of signals and operating frequency of semiconductor devices. In the aspect of dissipation control, chip packages also help dissipate heat generated by the silicon chip.

In addition to electrical performance and dissipation control, the small size of the microcontroller also demands smaller chip package size and denser I/O pad arrangements. In the future, a chip package may comprise several dies and opto-electronic elements, and minimizing the space between elements, maximizing the interconnectivity of elements, controlling signal frequency precisely, and matching impedance will be great issues for chip package designers. In conclusion, the prior art package technology, such as FCPGA, will not satisfy new requirements.

To solve the problems mentioned above, Intel Corp. has developed a Bumpless Build-Up Layer (BBUL) technology that embeds a die into a specialized, pc-board-like package, getting rid of solder bumps and connecting copper wires on the substrate directly.

FIG. 1 to FIG. 7 are schematic diagrams of conventional BBUL package technology. As shown in FIG. 1, a substrate 10 comprising a top surface 10a and a bottom surface 10b is provided. Please refer to FIG. 2. FIG. 2 depicts a through hole 12 formed by penetrating both the top surface 10a and the bottom surface 10b of the substrate 10.

Then, as shown in FIG. 3, a layer of tape 14 comprising an adhesive layer 13 is stuck to the bottom surface 10b of the substrate 10. The adhesive layer 13 causes the tape 14 to stick to the bottom surface 10b of the substrate 10. The tape 14 and the through hole 12 form a recessed cavity 15.

As shown in FIG. 4, an active surface 20a of a die 20 put facedown into the recessed cavity 15. A plurality of bonding pads 22 is positioned on the active surface 20a; a bottom surface 20b of the die 20 is toward up and a bottom surface 20b is coplanar with the top surface 10a of the substrate 10. The die 20 adheres to the tape 14 through the adhesive layer 13.

Then, as shown in FIG. 5, the gap between the substrate 10 and the die 20 is filled by an underfill 30 to fix the die 20 in the substrate 10. Next, as shown in FIG. 6, the tape 14 is torn off, exposing the active surface 20a of the die 20.

Finally, as shown in FIG. 7, the bottom surface 10b of the substrate 10 and the active surface 20a of the die 20 are routed, forming an interconnect layer 40 comprising a dielectric layer 42, a dielectric layer 44, a dielectric layer 46, wires in the dielectric layers, a solder resist layer 48 and bumps 49.

In the prior art BBUL technology, defects often occur during the process of routing wires on the surface layers. For example, after tearing off the tape 14, adhesive residue may be left on the bonding pads 22 positioned on the active surface 20a of the die 20. This problem decreases product quality, and increases the product cost so that the BBUL package may cost much more than the conventional package method.

Furthermore, because of the difference in the coefficients of thermal expansion of the die 20, the underfill 30 and the substrate 10, cracks may occur during the routing process. Moreover, the heat dissipation performance also needs to be improved in the conventional BBUL package, so there are still a lot of problems to be solved in the conventional BBUL package.

SUMMARY OF THE INVENTION

It is therefore a primary objective of the claimed invention to provide an embedded chip package, which can solve the problems of the prior art.

According to the present invention, an embedded chip package is provided. The embedded chip package comprises a double-sided substrate comprising a dielectric interposer, a first metal foil positioned on a first surface of the dielectric interposer, a second metal foil positioned on a second surface of the dielectric interposer, a recessed cavity having a bottom on the first metal foil formed in the second metal foil and in the dielectric interposer, a die positioned in the recessed cavity having a bottom contacting thermally with the first metal foil, a build-up material layer covering the second metal foil and an active surface of the die and the build-up material layer filling in the gap between the side of the die and the dielectric interposer, and at least one interconnect layer on the build-up material layer electrically coupled to a bonding pad disposed on the active surface of the die via a conductive via. Heat generated on the die during operation conducts through the first metal foil to an external environment.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
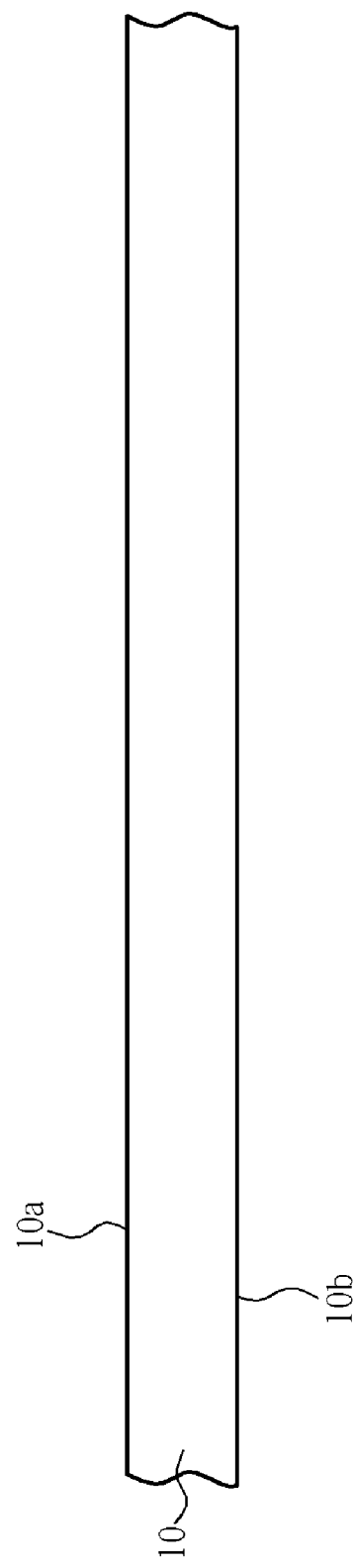
FIG. 1 to FIG. 7 are schematic diagrams of conventional BBUL package technology.
Figure 2:
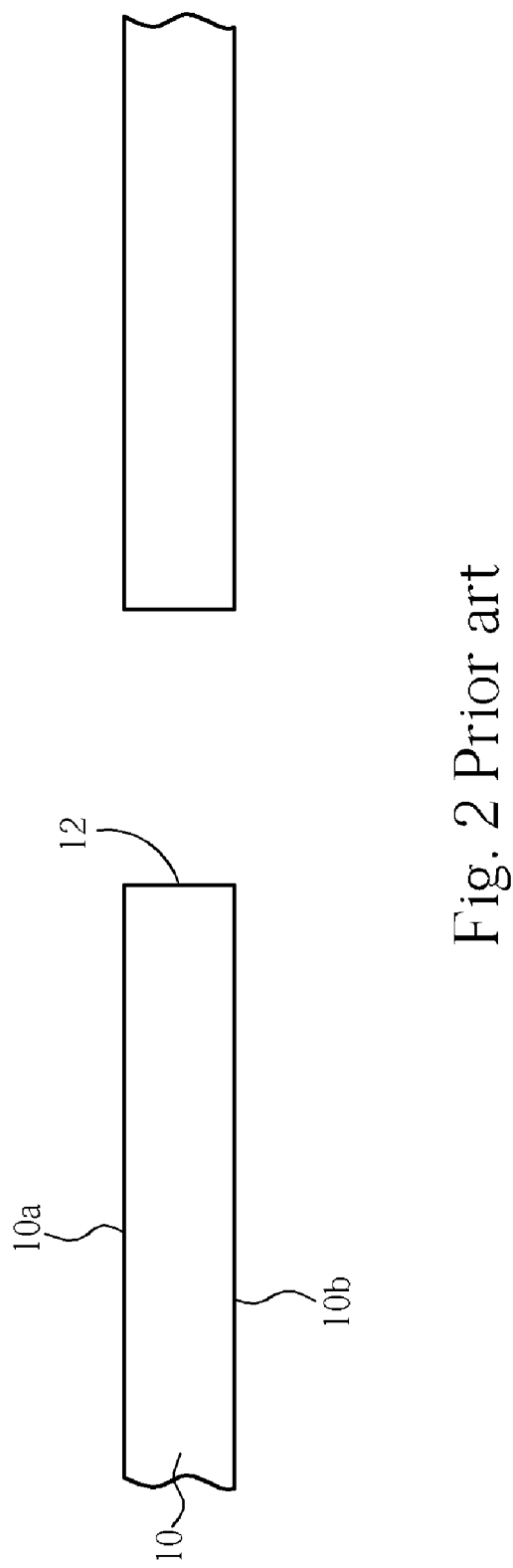
Figure 3:
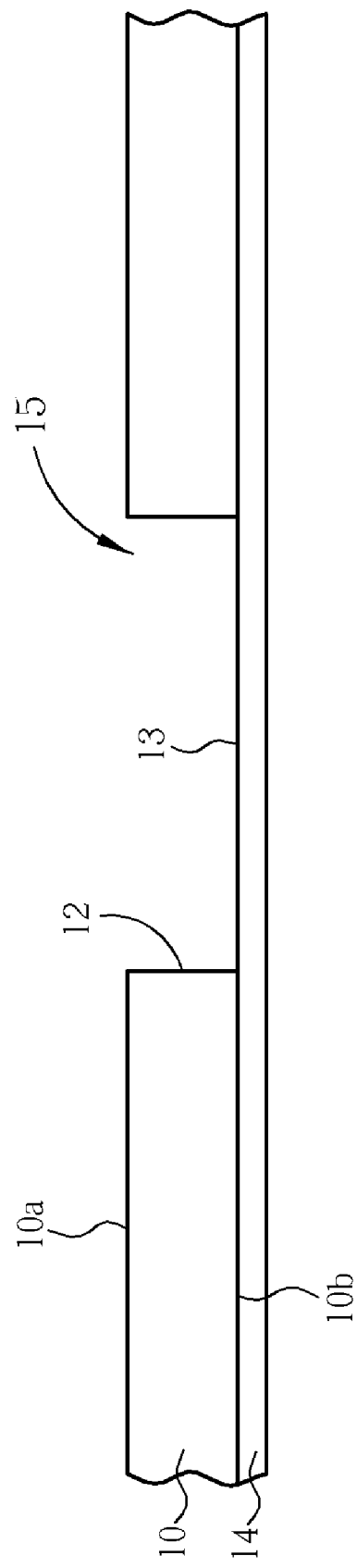
Figure 4:
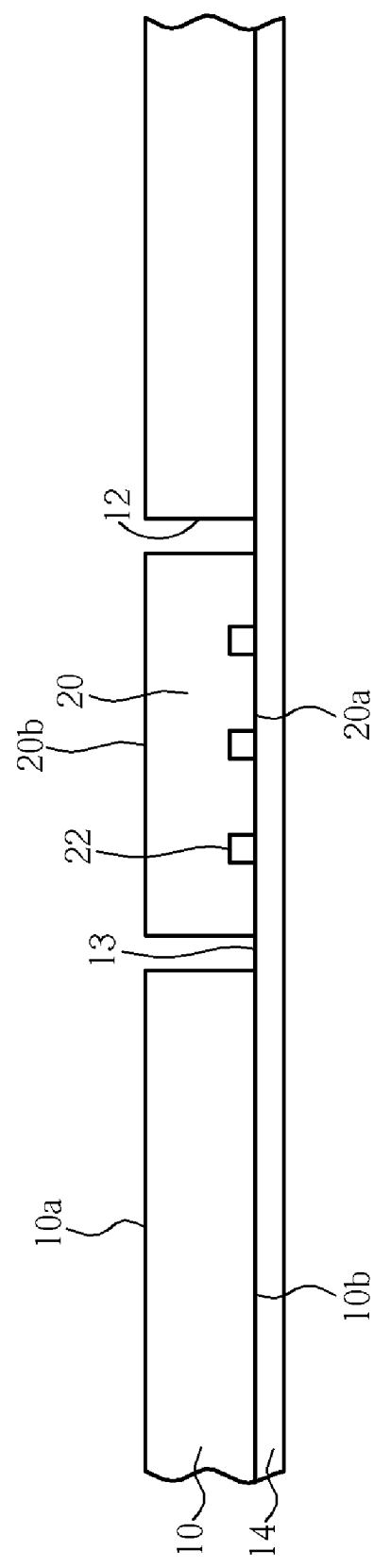
Figure 5:
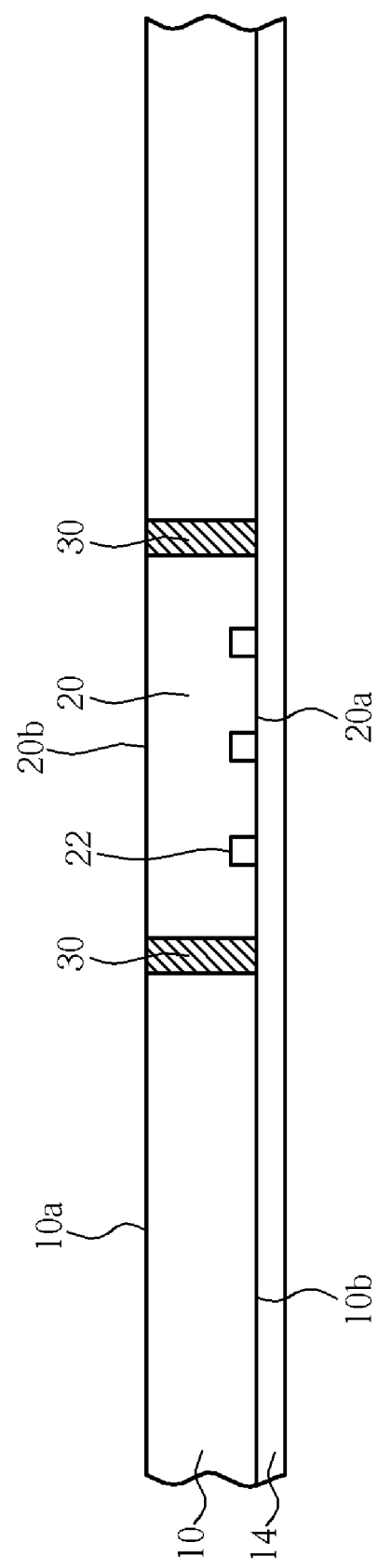
Figure 6:
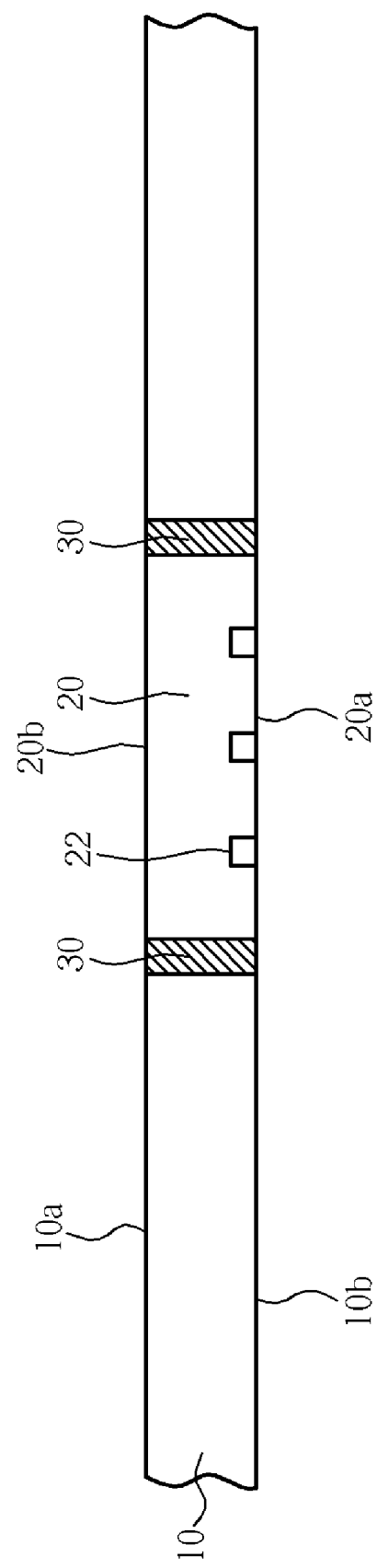
Figure 7:
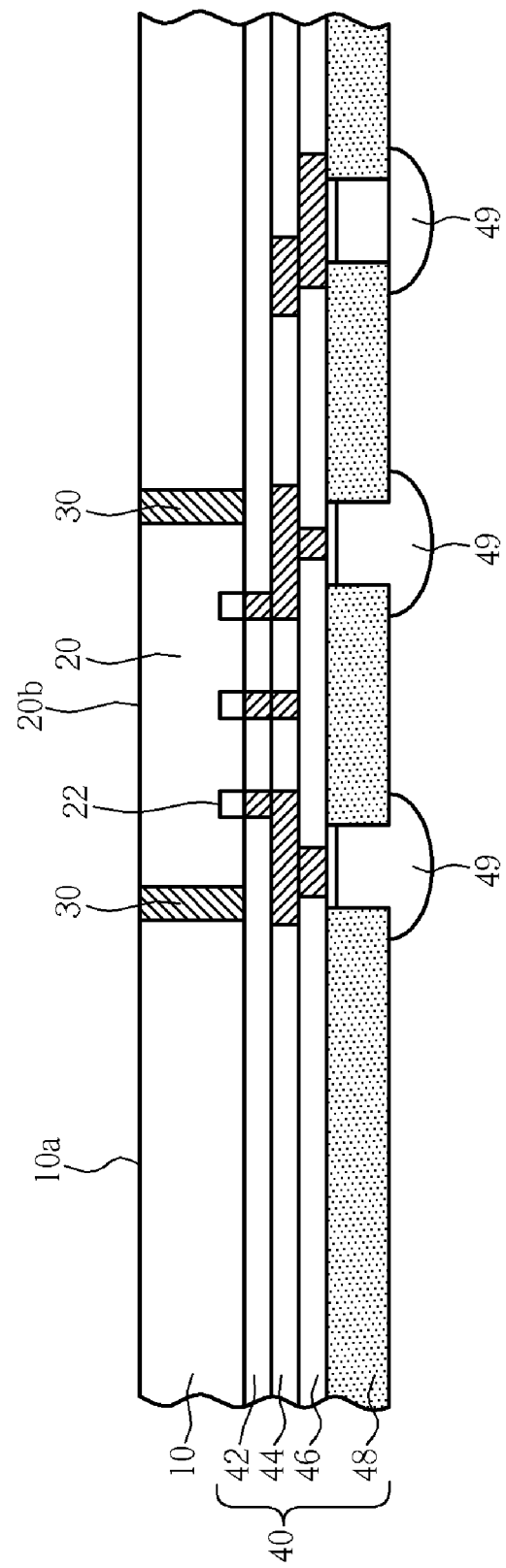
Figure 8:
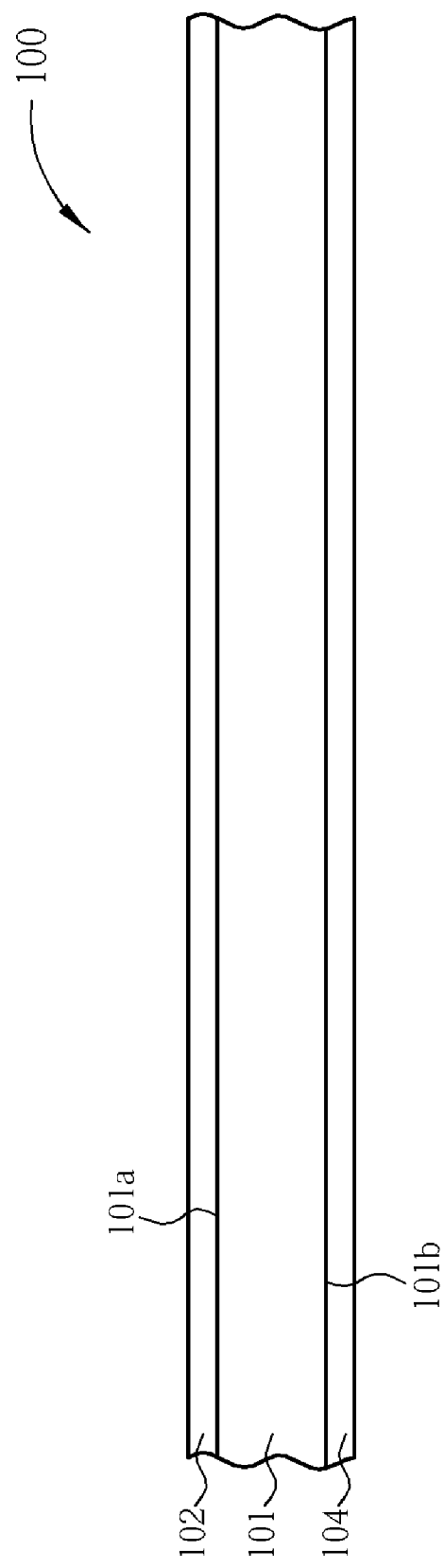
FIG. 8 to FIG. 23 are schematic of a side view of the embedded chip package in a manufacturing process.

Please refer to FIG. 8 through FIG. 23, which depict a side view of the embedded chip package in a manufacturing process. As shown in FIG. 8, first, a double-sided substrate 100, such as double-sided copper clad laminate (CCL), is provided, which comprises a dielectric interposer 101, a first metal foil positioned on a first surface 101a of the dielectric interposer, and a second metal foil 104 positioned on a second surface 101b of the dielectric interposer 101. The first metal foil 102 and the second metal foil 104 comprise copper, iron, gold, or aluminum.

Figure 9:
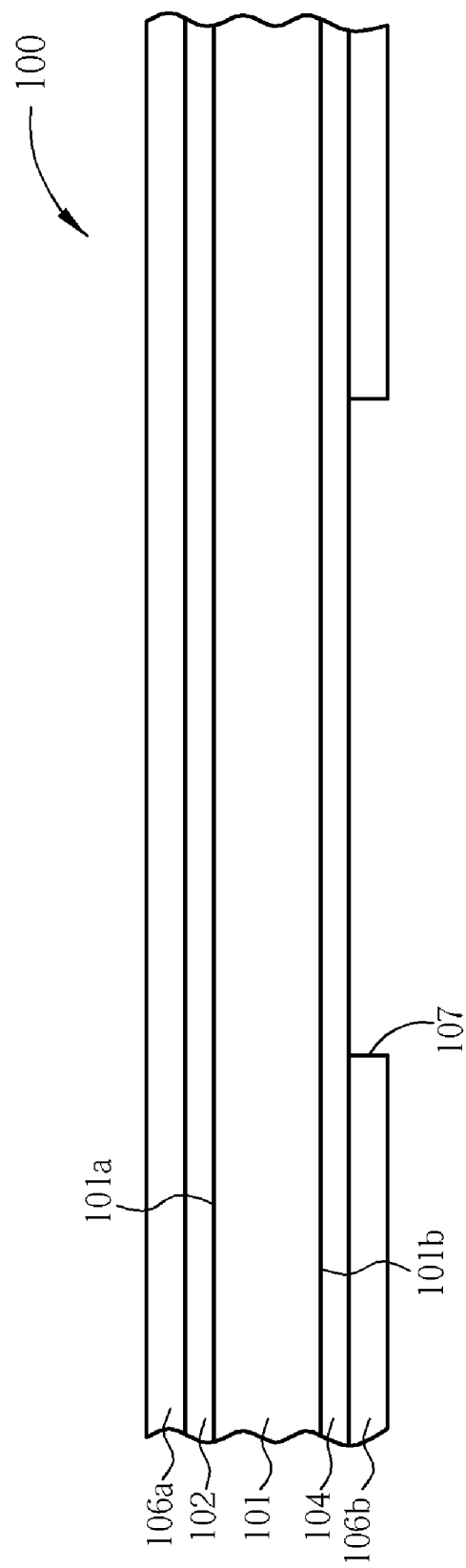

As shown in FIG. 9, a dry film 106a, 106b such as photoresist is formed on the first metal foil 102 and the second metal foil 104. An opening 107 is formed in the dry film 106b by an exposure and development process, and a part of the second metal foil 104 is exposed. The opening 107 defines a position of a copper window which will be formed in the next step.

Figure 10:
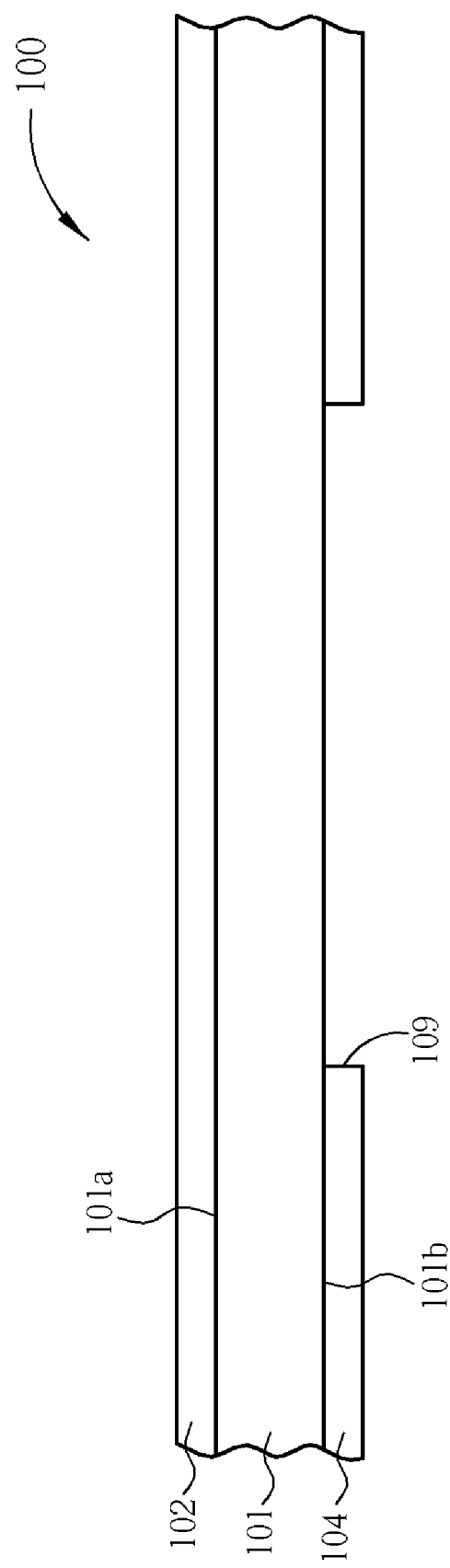

As shown in FIG. 10, a dry film 106a, 106b is used as an etching mask, the second metal foil 104 is etched through the opening 107, and a copper window 109 is formed in the second metal foil 104. Then, the dry film 106a, 106b is removed.

Figure 11:
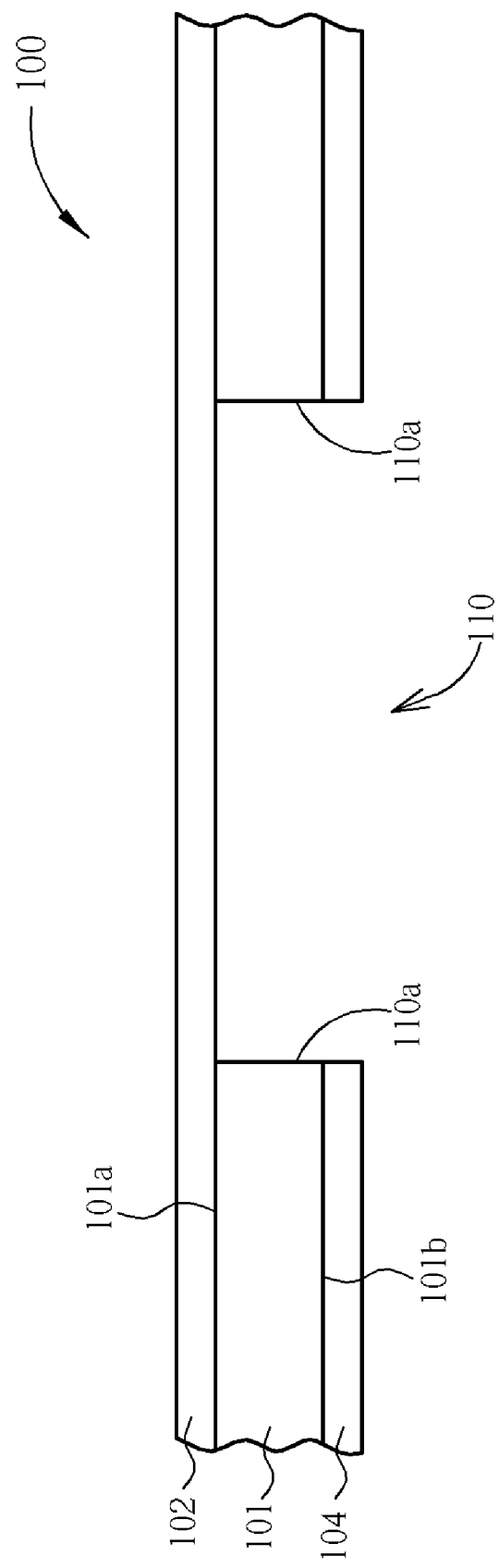

As shown in FIG. 11, a recessed cavity 110 is formed by a laser drilling process or a mechanical drilling process through the copper window 109. The recessed cavity 110 is defined by a surface of a sidewall 110a and the first metal foil 102.

According to the preferred embodiment of the present invention, the laser drilling process mentioned above utilizes a $CO_2$ laser. With suitable energy intensity, the copper has a low absorptivity to the $CO_2$ laser and the dielectric interposer 101 has a high absorptivity to $CO_2$ laser. The present invention is not limited to the $CO_2$ laser. A laser can be adjusted to a proper energy intensity allowing the copper to have a low absorptivity to the laser and the dielectric interposer 101 to have a high absorptivity to the laser when performing the laser drilling process, such that any laser that will not penetrate the first metal foil 102 can be used in the present invention.

Figure 12:
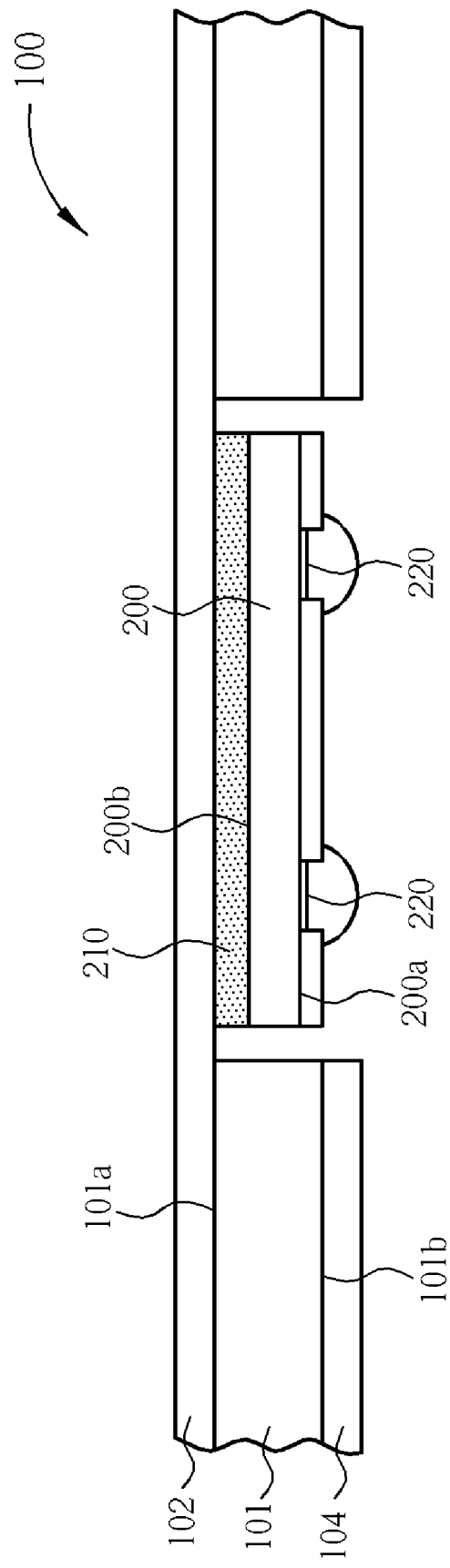

As shown in FIG. 12, a die 200 is put in the recessed cavity 100, wherein the bottom 200b of the die 200 is fixed on a surface of the first metal foil 102 in the recessed cavity 100 by an adhesive layer 210. The adhesive layer 210 comprises a heat dissipating glue. It is noteworthy that in other embodiments, a die can be positioned on the surface of the first metal foil 102 without using the adhesive layer 210. The active surface 200a of the die 200 comprises a plurality of bonding pads. Since the tape 14 is omitted, the adhesive residue problem on the active surface 200a is prevented.

In addition, the primary feature of the present invention is conduction of the heat generated on the die 200 during operation through the first metal foil 102 to an external environment. Because copper has good conductivity, the package in the present invention has much better heat dissipation performance than the conventional package.

Figure 13:
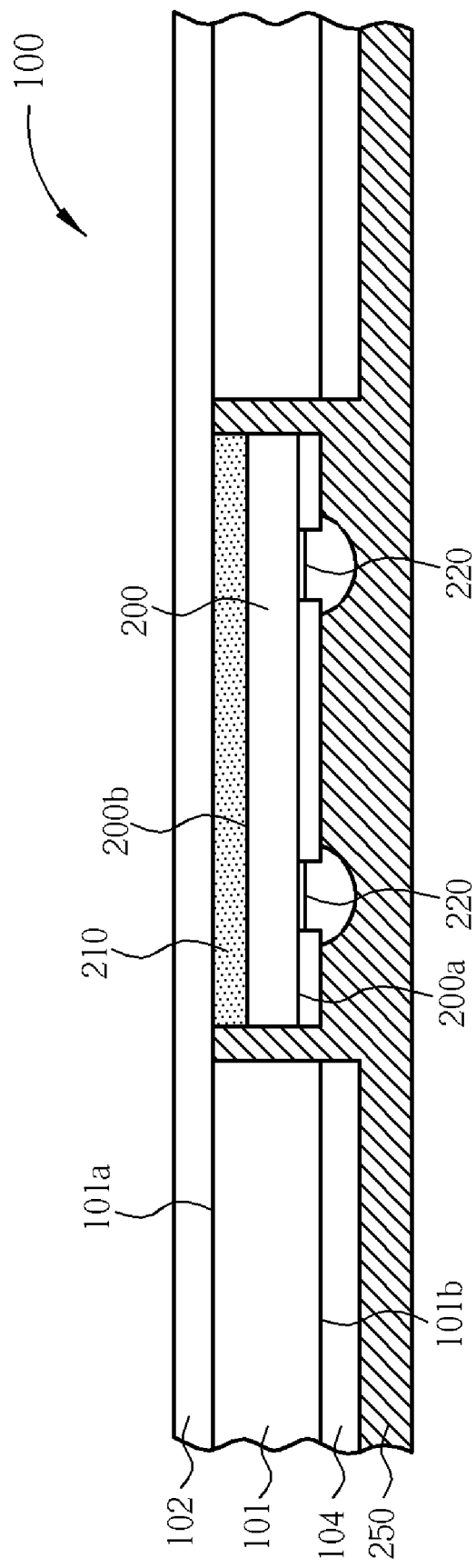

As shown in FIG. 13, a build-up material layer 250, such as ABF (Ajinomoto Build-Up), epoxy resin, or prepreg, covers the second metal foil 104 and the active surface 200a of the die 200. Then, by increasing temperature and pressure in a vacuum environment, a film pressing process is carried out to press the build-up material layer 250 into a gap between the die 200 and a sidewall 110a of the recessed cavity 110. The build-up material layer 250 is preferably ABF, which is provided by Ajinomoto Co., Inc. The ABF is an epoxy resin usually used as a build-up dielectric in a substrate manufacturing process.

Another feature of the present invention is that the die 200 is fixed by the ABF, epoxy resin, or prepreg, which is concurrently used as an build-up material of the packaging substrate. By filling up the recessed cavity 110 by the ABF, epoxy resin, or prepreg, the conventional underfill does not need to be used, and the difference in coefficient of thermal expansion can be decreased because material variety in the substrate is reduced.

Figure 14:
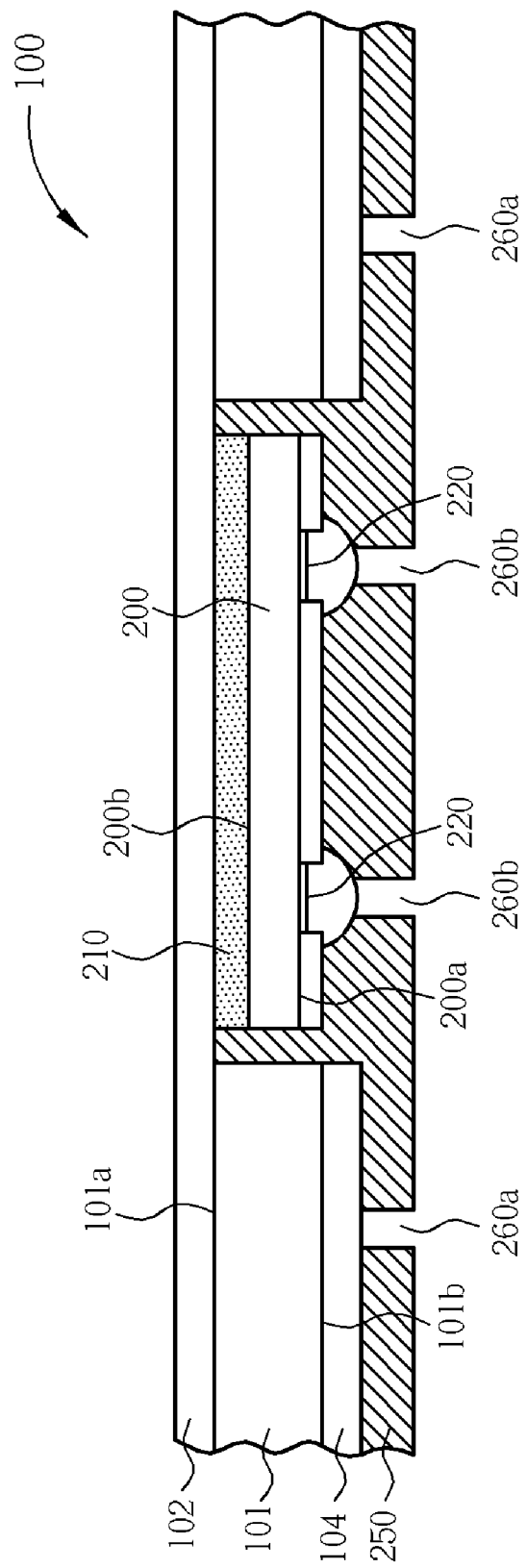

As shown in FIG. 14, a laser drilling process is performed. Through laser ablation, a plurality of contact holes 260a, 260b can be formed on the build-up material layer 250, wherein a part of the second metal foil 104 is exposed through the contact hole 260a, and a bonding pad 220 corresponding to the active surface 200a of the die 200 is exposed through the contact hole 260b. Further, according to different build-ups, an exposure or development process can be used as an alternative.

Figure 15:
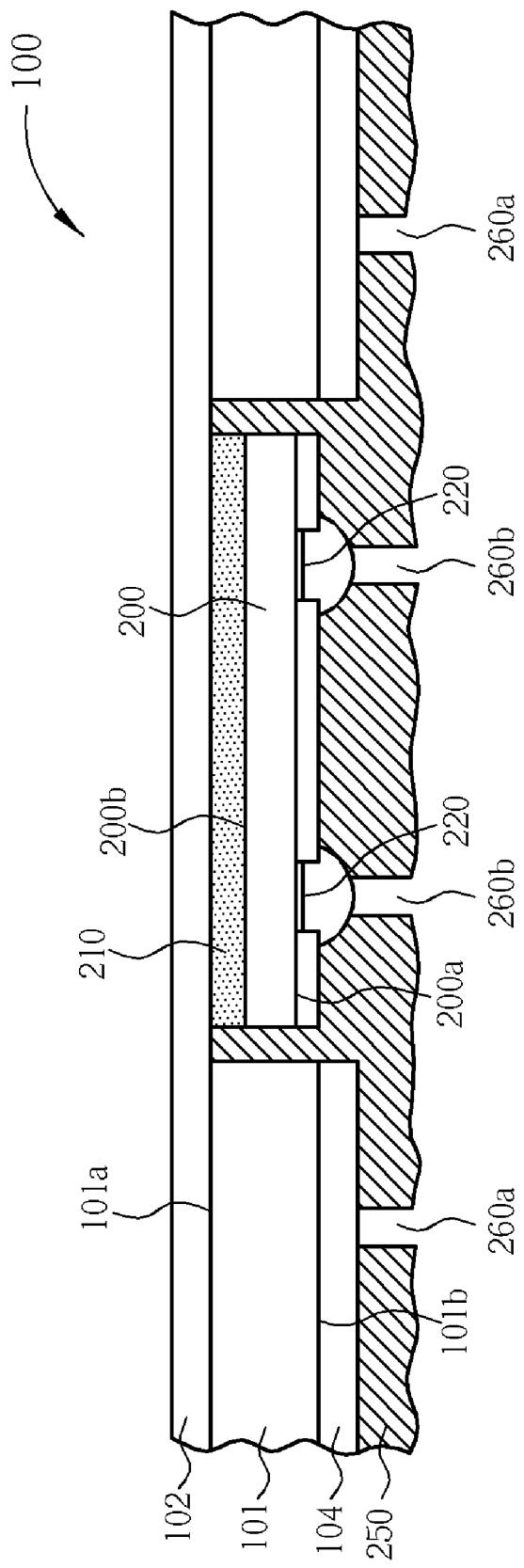

As shown in FIG. 15, a de-smear process is performed. During the de-smearing process, a surface of the build-up material layer 250 is roughened. The de-smear process can be performed by a plasma or wet process. However, the wet process is easily susceptible to external environment factors, such as concentration of solution, temperature or lifespan of batch solution. Therefore, the plasma process can provide more stable quality.

Figure 16:
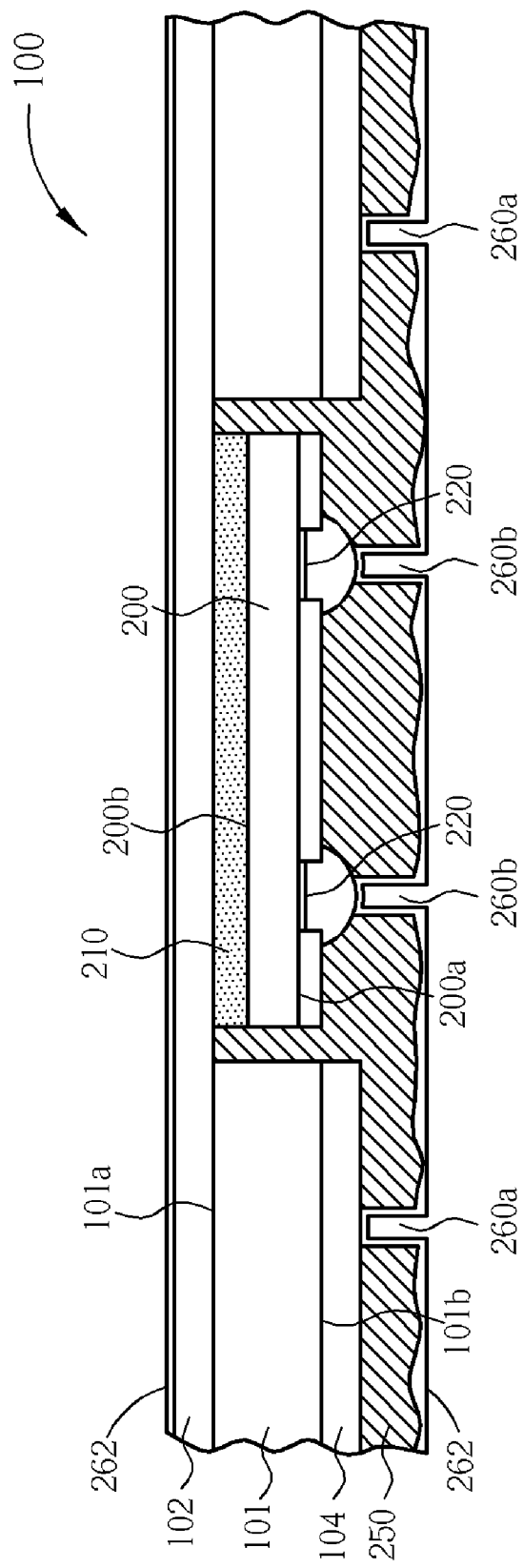
Figure 17:
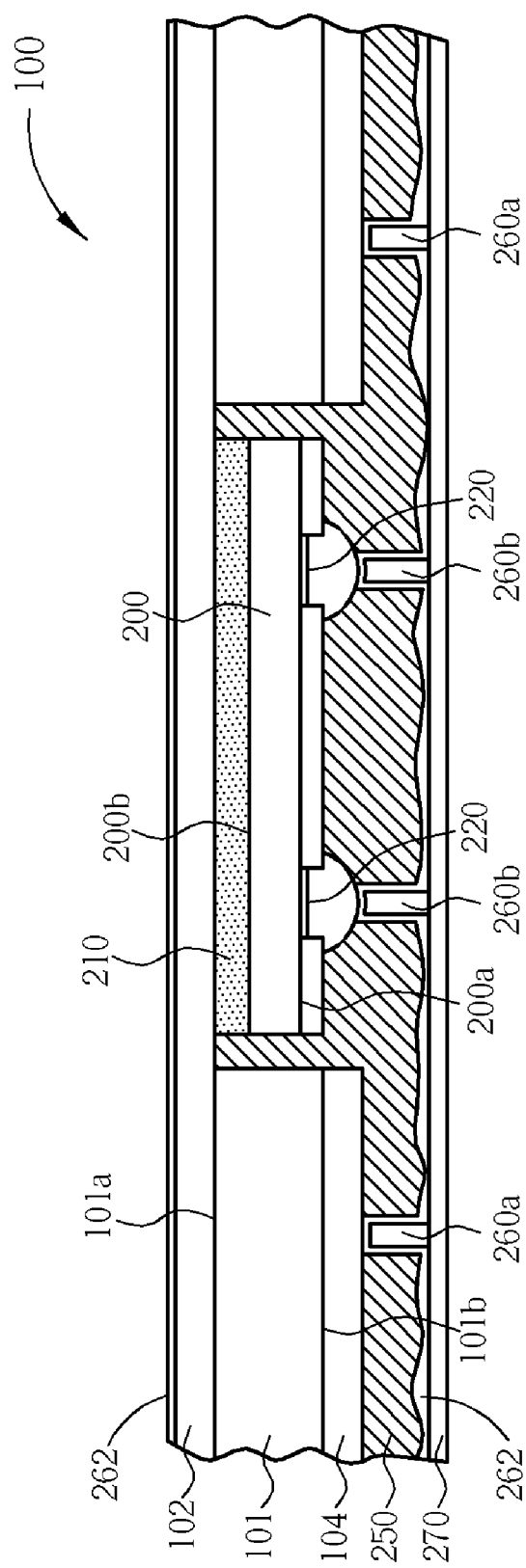

As shown in FIG. 16, an electroless Cu plating process is performed to form a copper film 262 on a surface of the build-up material layer 250, interior surfaces of the contact holes 260a, 260b and a surface of the first metal layer 102. A sputter process can be an alternative to the electroless Cu plating process. By the sputter process, the copper film 262 can be selected to form only on one side and the quality is more stable. As shown in FIG. 17, a dry film 270 such as photoresist is formed on the copper film 262.

Figure 18:
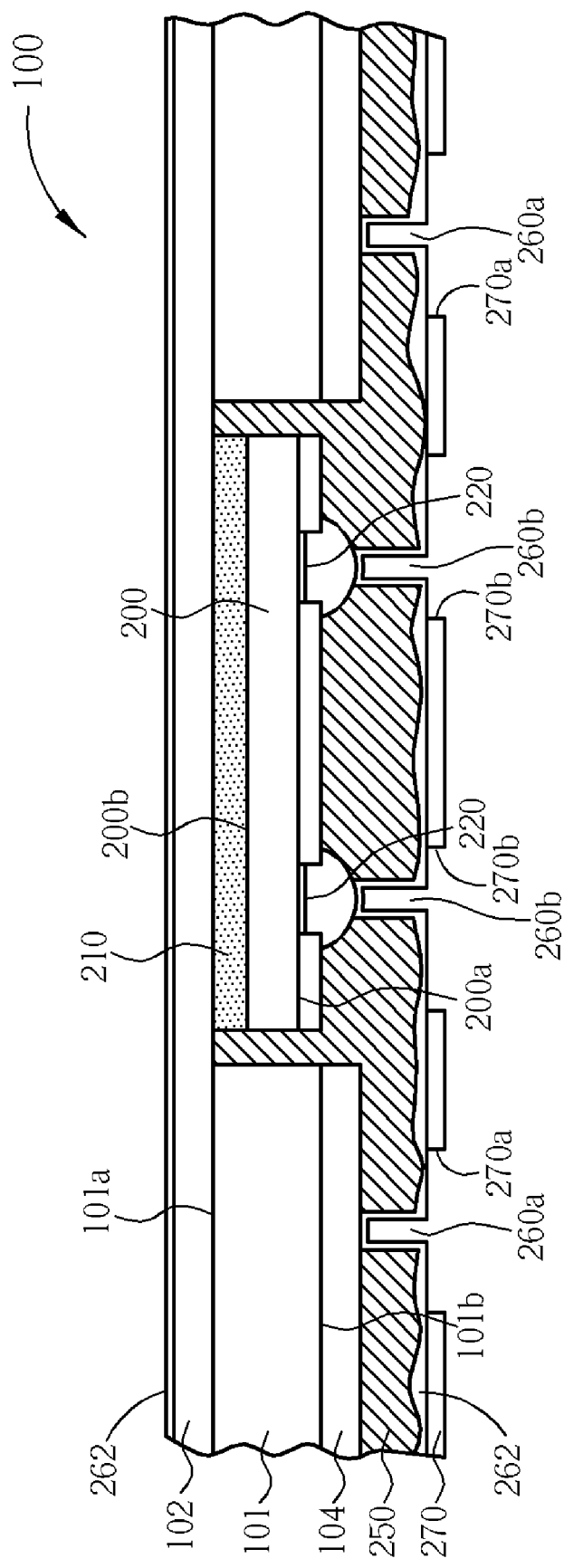

As shown in FIG. 18, by the exposure and development process, a circuit trench pattern 270a, 270b is formed on the dry film 270, wherein the contact hole 260a is exposed through the circuit trench pattern 270a and the contact hole 260b is exposed through the circuit trench pattern 270b.

Figure 19:
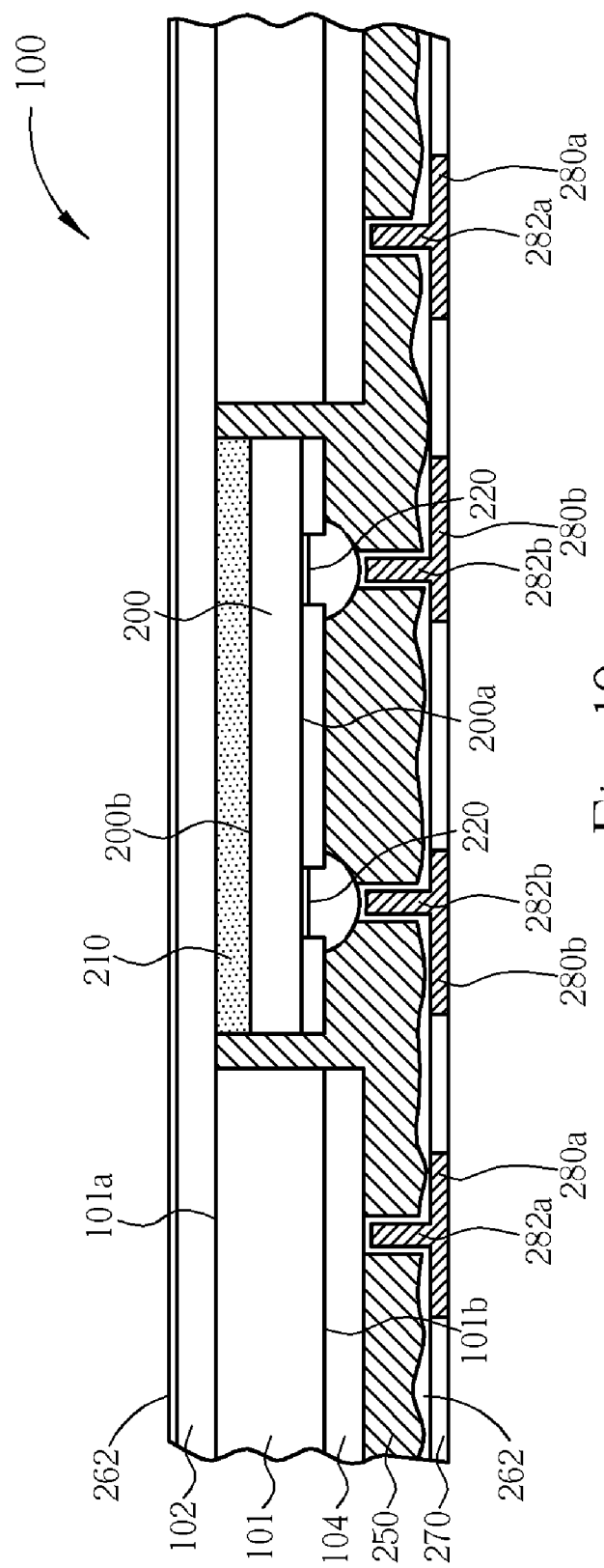
Figure 20:
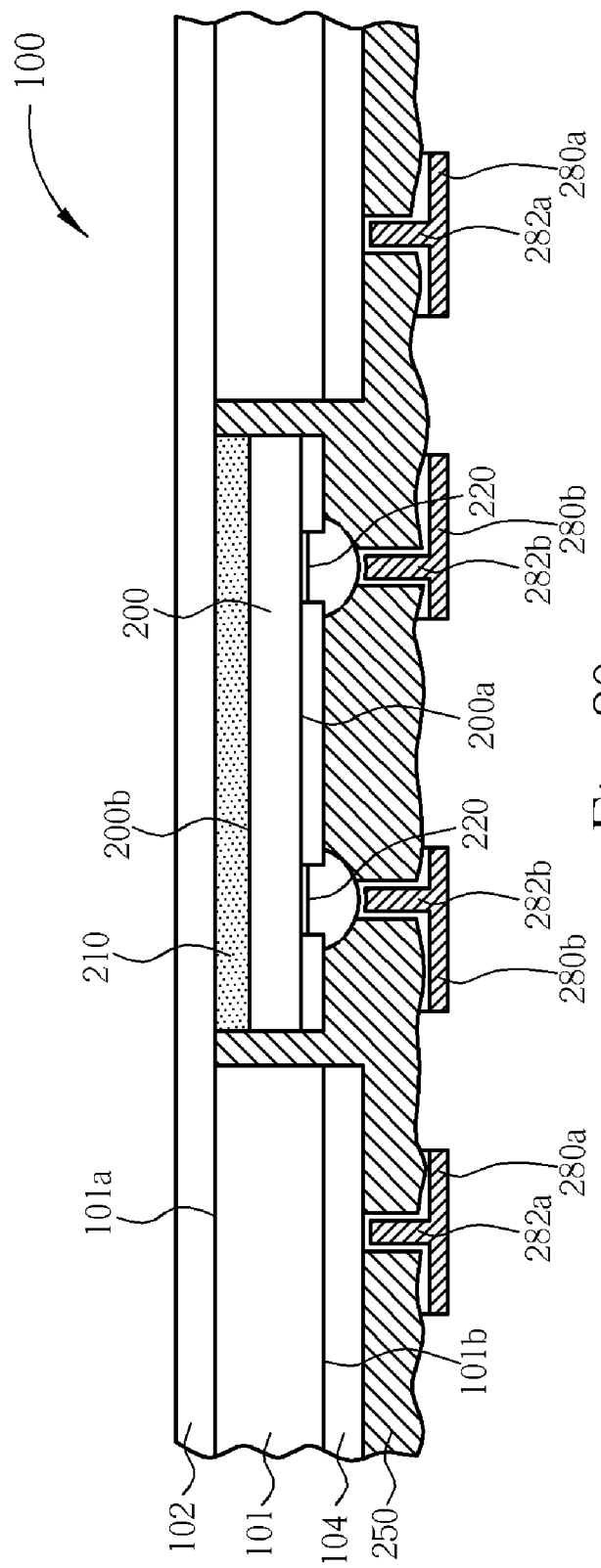

As shown in FIG. 19, a Cu electroplating process is performed and a circuit pattern layer 280a, 280b and conductive vias 282a, 282b are formed in the circuit trench pattern 270a, 270b and the contact holes 260a, 260b respectively. As shown in FIG. 20, removing the dry film 270. The process shown in FIG. 13 to FIG. 20 can be repeated to add layers depending on different design purposes.

Figure 21:
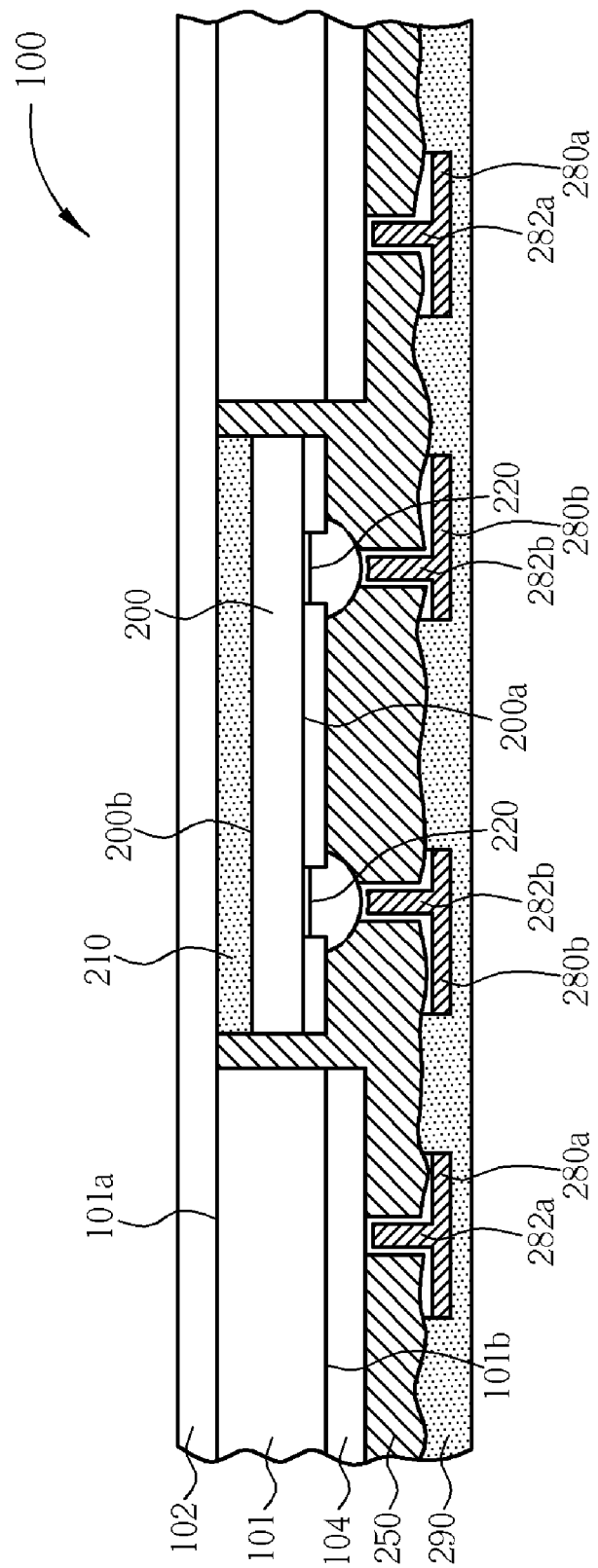
Figure 22:
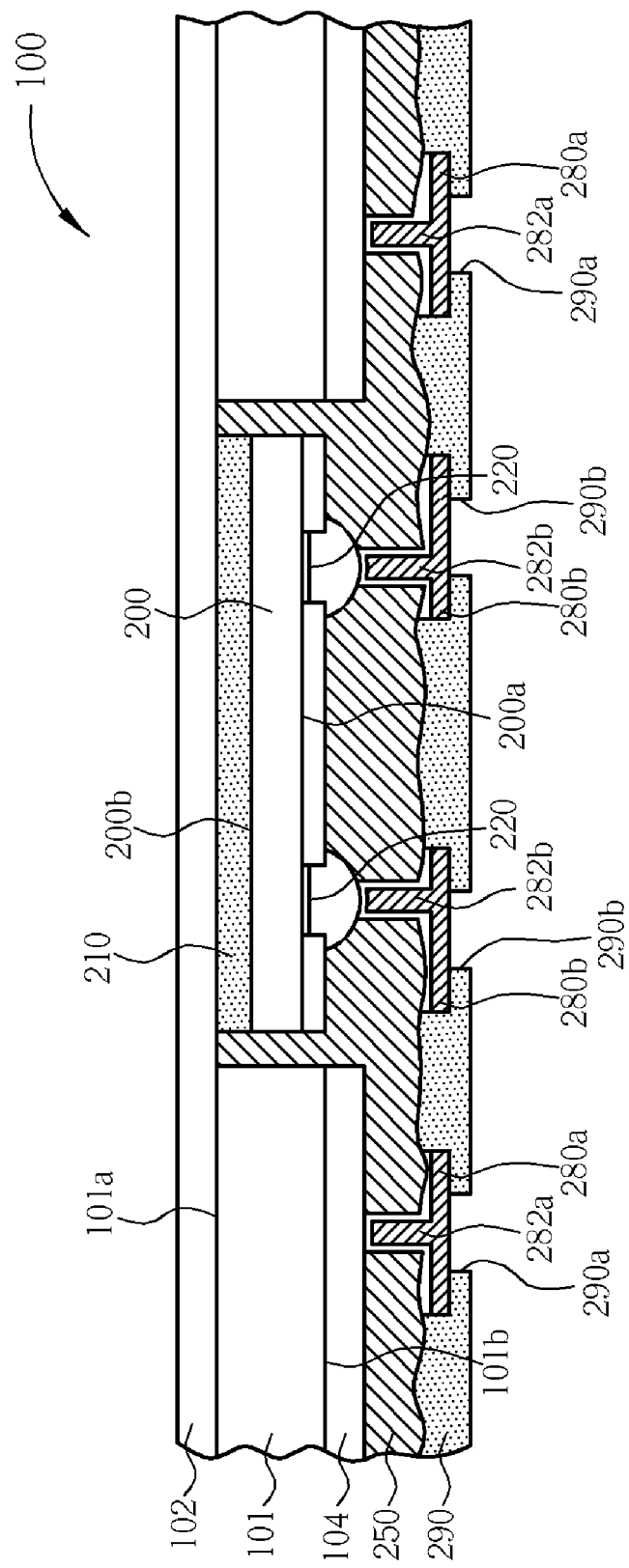
Figure 23:
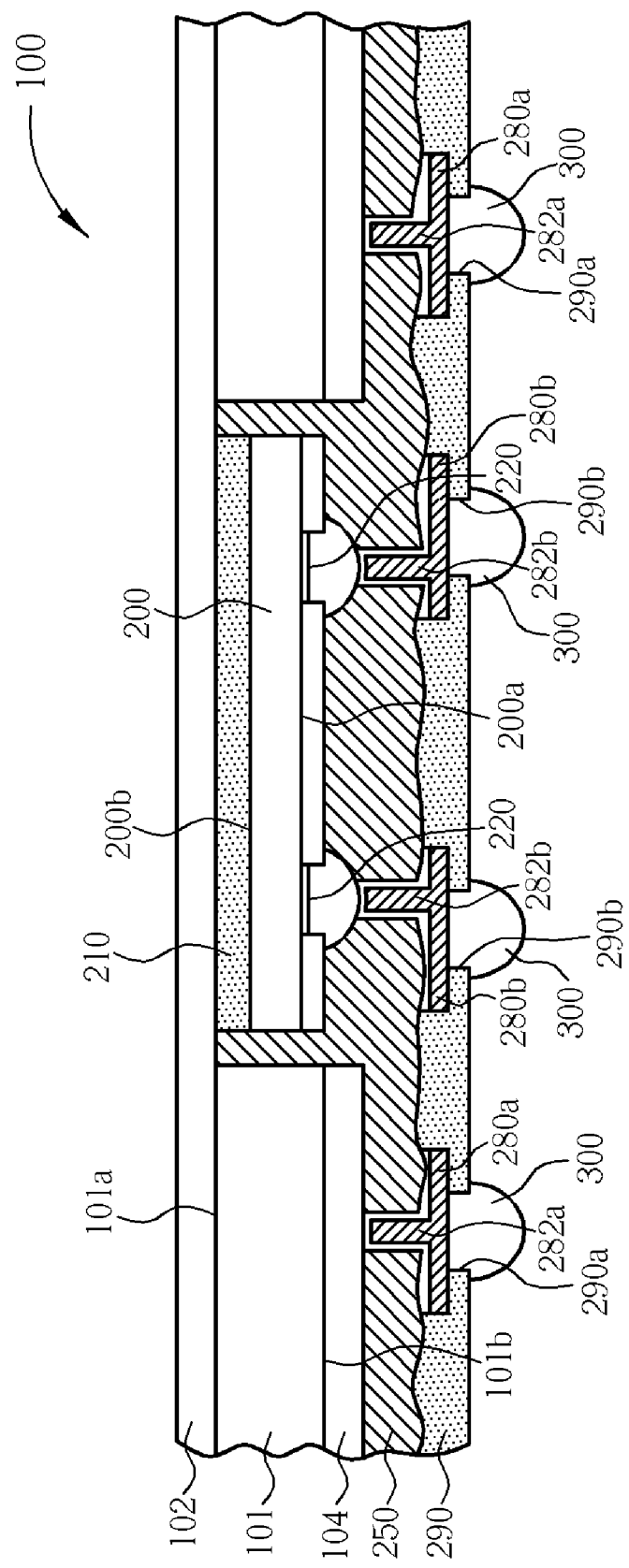

As shown in FIG. 21, after the circuit pattern layer 280a, 280b and the conductive via 282a, 282b are formed, a solder resist layer 290 is formed on a surface of the circuit pattern layer 280a, 280b. Then, as shown in FIG. 22, by exposure and development processes, an opening 290a, 290b is formed in the solder resist layer 290 and the circuit pattern layer 280a, 280b is exposed through the opening 290a, 290b. As shown is FIG. 23, a bump 300 is formed in the opening 290a, 290b.

As described above, the present invention comprises advantages as follows:

(1) By using a double-side substrate as a starting material, the recessed cavity 110 can be formed by a laser with suitable energy or mechanical drilling, and the first metal foil 102 does not need to be penetrated during the formation of the recessed cavity 110. The die 200 is directly positioned on the first metal foil 102 within the recessed cavity 110, so that the heat of the die 200 generated during operation can be conducted to the external environment by contact with the first metal foil 102.

(2) Since the use of tape in the prior art BBUL process is omitted, the adhesive residue problem and is prevented.

(3) The die 200 is fixed in the recessed cavity 110 by filling up the side of the die 200 by the build-up material 250 in the vacuum environment so that the conventional underfill does not need to be used, and the difference in coefficients of thermal expansion can be decreased because material variety in the substrate is reduced by omitting the underfill.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An embedded chip package with improved heat dissipation performance comprising:
a double-sided substrate comprising a dielectric interposer, a first metal foil positioned on a first surface of the dielectric interposer, and a second metal foil directly contacting a second surface of the dielectric interposer;

a recessed cavity formed in the second metal foil and the dielectric interposer, and the recessed cavity has a bottom on the first metal foil;

a die positioned in the recessed cavity having a bottom contacting thermally with the first metal foil;

a build-up material layer covering the second metal foil and an active surface of the die, the build-up material layer filling in the gap between the side of the die and the dielectric interposer;

a bonding pad disposed on the active surface of the die;

at least one first interconnect layer on the build-up material layer, and the first interconnect layer being directly above the bonding pad; and a first conductive via electrically coupling to the first interconnect layer and the bonding pad; wherein heat generated on the die during operation conducts through the first metal foil to an external environment.

2. The embedded chip package of claim 1, wherein the dielectric interposer comprises glass fiber or resin.

3. The embedded chip package of claim 1 further comprises an adhesive layer positioned between the bottom of the die and the first metal foil.

4. The embedded chip package of claim 3, wherein the adhesive layer comprises a heat dissipating glue.

5. The embedded chip package of claim 1, wherein the adhesive layer comprises Ajinomoto Build-Up, epoxy resin or prepreg.

6. The embedded chip package of claim 1 further comprising a solder resist layer positioned on the first interconnect layer.

7. The embedded chip package of claim 6, wherein the solder resist layer comprises at least a first opening for exposing a part of the first interconnect layer, and a first bump is positioned inside the first opening.

8. The embedded chip of claim 1, wherein the die is positioned directly on a surface of the first metal foil.

9. The embedded chip package of claim 1, further comprising at least one second interconnect layer on the build-up material layer, wherein the second interconnect layer is at the same plane with the first interconnect layer, and a second conductive via electrically couples to the second interconnect layer and the second metal foil.

10. The embedded chip package of claim 7, further comprising at least one second interconnect layer on the build-up material layer, wherein the second interconnect layer is at the same plane with the first interconnect layer, and a second conductive via electrically couples to the second interconnect layer and the second metal foil.

11. The embedded chip package of claim 10, wherein the solder resist layer comprises at least an second opening for exposing a part of the second interconnect layer, and a second bump is positioned inside the second opening.

* * * * *